(12) United States Patent
Albrecht

(10) Patent No.: US 7,411,450 B2
(45) Date of Patent: Aug. 12, 2008

(54) CIRCUIT AND METHOD FOR AMPLIFICATION OF AN ELECTRICAL INPUT SIGNAL

(75) Inventor: Adam Albrecht, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 76 days.

(21) Appl. No.: 11/633,737

(22) Filed: Dec. 5, 2006

(65) Prior Publication Data

US 2007/0159243 A1 Jul. 12, 2007

(30) Foreign Application Priority Data

Dec. 5, 2005 (DE) .................. 10 2005 058 039

(51) Int. Cl.
*H03F 3/68* (2006.01)
(52) U.S. Cl. .............. 330/124 R; 330/286; 330/295
(58) Field of Classification Search .......... 330/53, 330/124 R, 286, 295; 324/117 R, 322
See application file for complete search history.

(56) References Cited

U.S. PATENT DOCUMENTS 5,872,481 A 2/1999 Sevic et al. ............. 330/51
6,388,528 B1 * 5/2002 Buer et al. ............. 330/295
6,825,719 B1 * 11/2004 Barak et al. ............ 330/124 R

FOREIGN PATENT DOCUMENTS

DE 198 11 839 9/1999

* cited by examiner

*Primary Examiner*—Khanh V Nguyen
(74) *Attorney, Agent, or Firm*—Schiff Hardin LLP

(57) ABSTRACT

In a circuit and a method for amplification of an electrical input signal, a signal splitter divides the input signal into a first partial signal in a first signal path and a second partial signal in a second signal path. The first signal path has a first amplification stage for amplification of the first partial signal and the second signal path has a second amplification stage for amplification of the second partial signal. Each of the two amplification stages is supplied with current by a current supply device. Both amplified partial signals are recombined into an output signal by a signal combination element downstream from the amplification stages. The first amplification stage and the second amplification stage are coupled with a regulation device that regulates the amplification of the first partial signal dependent on a current difference between a supply current requirement of the second amplification stage and a supply current requirement of the first amplification stage and which regulates the amplification of the second partial signal dependent on a current difference between the supply current requirement of the first amplification stage and the supply current requirement of the second amplification stage.

14 Claims, 2 Drawing Sheets

CIRCUIT AND METHOD FOR AMPLIFICATION OF AN ELECTRICAL INPUT SIGNAL

BACKGROUND OF THE INVENTION

1. Field of the Invention

The present invention concerns a circuit arrangement and method for amplification of an electrical input signal and a magnetic resonance system with such a circuit arrangement.

2. Description of the Prior Art

Amplification circuits are known that have a signal splitter that splits the input signal into a first partial signal and a second partial signal. A first signal path has a first amplification stage for amplification of the first partial signal and a second signal path has a second amplification stage for amplification of the second signal. Each of the two amplification stages is supplied with current from a power supply device. A signal combination element downstream from the amplification stages recombines the two partial signals into one output signal. The invention furthermore concerns a corresponding method for amplification of an electrical input signal.

Such circuit arrangements are in particular used in magnetic resonance systems for amplification of the radio-frequency pulses necessary for imaging. The amplification ensues with what a method known as a coherent power combination method, in which the signals to be amplified are superimposed with the amplification signals in phase, with not only the amplification of the signal being achieved on average but also the peak voltage is actually amplified. Very large amplifications of radio-frequency pulses are thereby possible, as they are required within magnetic resonance systems.

The amplification stages typically used in such circuit arrangements use power transistors designed on a semiconductor basis. One problem is that such amplification stages should not be operated above a maximum barrier layer temperature (junction temperature) of the transistors since this can lead to a premature failure of the amplification stage. The current junction temperature of the amplification stage depends on the current or on the current output power. In the amplification stages typically used in amplification devices in magnetic resonance systems, for example, the junction temperature cannot be more than 120° C. If this temperature is observed, the lifespan of the amplification stages is approximately 10 to 15 years.

If the junction temperature of 120° C. is observed, the output power is maximally limited to approximately 10 to 15 kW, depending on the type of amplification stage. In order to achieve a greater output power, as described above a number of amplification stages are combined in parallel in a circuit arrangement. This means that the signal to be amplified is initially divided (preferably symmetrically) in a signal splitter such that each partial signal exhibits only half of the output power. These partial signals are then maximally amplified by respective amplification stages and the amplified signals are subsequently added together again so that ultimately two times the power of the maximum output power achievable by the individual amplification stages can be achieved.

Due to tolerances in the transistors, it disadvantageously occurs that the amplification stages require different currents. This means that the amplification stages used within the circuit arrangement heat differently and thus possibly must be deactivated earlier when they reach the maximum allowed junction temperature. This mechanism leads on the one hand to a situation that the power loss in the circuit arrangement increases and its efficiency consequently decreases. It can additionally lead to an asymmetrical output power of the individual amplification stages, which leads to additional power losses. When this problem has previously been encountered in the field, the circuit has been provided with a cooling arrangement or the number of the power transistors is increased. Both methods significantly increase the energy expenditure and the costs for the amplification.

SUMMARY OF THE INVENTION

An object of the present invention is to provide a circuit arrangement and a method of the aforementioned type in which the problems described above are avoided or at least reduced in a simple and cost-effective manner.

This object is achieved by a circuit arrangement having a signal splitter on the one side that divides the input signal into a first partial signal and a second partial signal, which respectively, preferably exhibit half of the power of the input signal. The two partial signals are each conducted via separate signal paths. An amplification stage for amplification of the appertaining partial signal is located in each of the two signal paths. These two amplification stages are formed in a known manner from semiconductor components and exhibit the typical component tolerances. A supply current for each of the two amplification stages is provided by a power supply device. This can be a common power supply device for both amplification stages, or separate power supply devices. In the respective amplification stages the partial signal are amplified corresponding to a required amplification and are supplied to a signal combination element downstream from the amplification stages. The signal combination element additively recombines the two amplified partial signals into an amplified output signal.

According to the invention, the first amplification stage and the second amplification stage are both coupled with a regulation device. This regulation device regulates the first amplification stage so that the amplification of the first amplification stage is regulated dependent on a current difference between a supply current requirement of the second amplification stage and a supply current requirement of the first amplification stage. The regulation functions the same for the second amplification stage, only a current difference between the supply current requirement of the first amplification stage and a supply current requirement of the second amplification stage is used for regulation. This means that the regulation of each the first amplification stage and of the second amplification stage depends on the same current difference magnitude, but with different algebraic signs.

The above object also is achieved in accordance with the invention by a method in which an input signal is divided into a first partial signal and a second partial signal by a signal splitter. The first partial signal is supplied to a first amplification stage and amplified therein. The second partial signal is supplied to a second amplification stage and amplified therein. After the amplification, the two partial signals are recombined into an output signal by means of a signal combination element. The amplification by the first amplification stage is regulated dependent on a current difference between a supply current requirement of the second amplification stage and a supply current requirement of the first amplification stage. Analogous to this, the amplification by the second amplification stage is regulated dependent on a current difference between a supply current requirement of the first amplification stage and a supply current requirement of the second amplification stage.

The inventive controller has the advantage that if the current requirement of the first amplification stage is greater than the current requirement of the second amplification stage, the amplification of the first partial signal is reduced because the amplification of the first amplifier is dependent on the difference between the two currents. A lower amplification accompanies a lower output power and a lower current requirement. Since in reverse the amplification of the second amplification stage is a function of the negative current difference, i.e. of the first supply current minus the second supply current, the amplification of the second partial signal is increased. The second amplification stage thus generates a higher output power and requires a higher supply current.

The reverse case exists when the supply current of the second amplification stage is higher than the supply current of the first amplification stage. In this case, the amplification by the first amplification stage is automatically increased by the inventive regulation and the amplification of the second partial signal by the second amplification stage is automatically reduced by the inventive regulation.

In the equilibrium state, since they require the same currents both amplification stages have the same junction temperature and thus also the same difference from the maximum allowable junction temperature. This allows each amplification stage to operate with the highest possible operating current and consequently with the maximum possible (and nevertheless safer) junction temperature. In spite of maximum output power, the risk is thereby reduced (or even entirely avoided) of a too-early monitoring alarm activation or even an automatic deactivation of an amplification stage occurring due to overheating of one of the amplification stages. Expensive additional cooling thus is not required. As a secondary effect, power losses in the recombination of the signals are reduced or minimized because the output powers of both amplification stages in the circuit arrangement are kept equal.

In an embodiment of the invention, the signal splitter effects a phase shift of the partial signals relative to one another. In this embodiment of the invention, the signal combination element resets the phase shift with the same amplitude. This means that, if the signal splitter implements a phase shift of the first partial signal relative to the second partial signal (for example by 180°), the signal combination element implements a phase shift of the first partial signal relative to the second partial signal by −180° before the recombination of the partial signals. This can be achieved by suitable delay elements at the output of the signal splitter and at the input of the signal combination element. By means of such a phase shift, a better decoupling of both parallel amplification stages from one another is achieved.

In a particularly advantageous embodiment, the relative phase shift between the partial signals amounts to 90°. Crosstalk or over-coupling of the one partial signal with the other partial signal upon the recombination is avoided as far as it is possible and the two amplification stages are insensitive relative to load changes at the output, which could be caused by reflections from the signal combination element.

In a further embodiment of the circuit arrangement, the regulation device is upstream of the actual amplification stage. This means that, for example, a variable gain control unit (amplifier control unit) or a corresponding variable attenuator unit with which the amplification of the signal is regulated, is located before the actual amplification stage. Alternatively, it is possible for such a variable amplifier control unit or attenuator unit to be integrated into the actual amplification stage.

In a preferred variant of the invention, an amplification factor of the first amplification stage is corrected by a correction function, which depends on the current difference between a supply current requirement of the second amplification stage and a supply current requirement of the first amplification stage. An amplification factor of the second amplification stage is correspondingly likewise corrected by a correction function, which in turn depends on the current difference between a supply current requirement of the first amplification stage and a supply current requirement of the second amplification stage.

This means that the amplification to be achieved or the total amplification of the circuit arrangement is predetermined by an external requirement, for example by a radio-frequency system in a magnetic resonance system that predetermines an amplification factor corresponding to the desired strength of the radio-frequency pulses for a measurement to be implemented. A suitable correction of this amplification factor then ensues merely with the aid of the correction function in order to ensure that both amplification stages within the inventive circuit arrangement operate with the same supply current and thus also deliver identical output powers.

The correction functions should be mathematically monotonous functions. For example, linear, quadratic or logarithmic functions are suitable depending on the specific design of the amplification stages.

In another embodiment of the invention, a number of amplification stages are integrated in cascaded fashion into a circuit arrangement in order to achieve even higher output power. The individual amplification stages of such an inventive "superordinate" circuit arrangement are thereby themselves designed like the inventive circuit arrangements described in the preceding.

This means that, as described above, the superordinate circuit arrangement at its circuit input has a signal splitter that divides the input signal into two "superordinate" partial signals and supplies each of these partial signals on its own signal path to a separate amplification stage. Each of these amplification stages of the superordinate circuit arrangement is inventively designed as a "subordinate" circuit arrangement and itself comprises in turn a signal splitter that respectively divides the appertaining input signal of this individual amplification stage into two "subordinate" partial signals. Both of the subordinate partial signals in the subordinate circuit arrangements are respectively in turn supplied to separate signal paths of separate amplification stages in which—as already described—the partial signals experience an amplification. A combination element that recombines the amplified, subordinate partial signals is arranged at the end of the signal paths in each of the subordinate circuit arrangements. The amplification stages in the respective signal path in the subordinate circuit arrangements are thereby regulated by means of corresponding regulation devices dependent on the difference of the respective supply currents necessary for amplification.

The amplified "superordinate" partial signals coming from the subordinate circuit arrangements acting as amplification stages of the superordinate circuit arrangement are then appropriately recombined again in a signal combination element of the superordinate circuit arrangement. Insofar as a phase shift ensues in the signal splitters, this phase shift is cancelled again by a corresponding phase shift in the recombination.

The superordinate circuit arrangement is designed in the inventive manner or, respectively, is operated according to the inventive method. This means that a regulation of the amplification ensues dependent on the currents required in the respective amplification stages. These currents are, however, now the sum currents, i.e. the total currents or the total current requirement that is required in the respective subordinate circuit arrangement (which respectively forms the amplification stages within the superordinate circuit arrangement).

Such a cascade-like design can be executed in two stages (but also in multiple stages) by the amplification stages within the subordinate circuit arrangement themselves being designed as inventive circuit arrangements. This means that it is possible in the inventive manner to use not only two but also four, eight, sixteen, thirty-two or more individual semiconductor amplification stages within the entire circuit arrangement. Nearly arbitrarily high output powers can thereby be achieved.

The aforementioned circuit arrangement and the aforementioned method are—as already mentioned—particularly suitable for amplification of radio-frequency pulses in magnetic resonance examination systems. They can also be used on other fields for amplification of arbitrary signals.

DESCRIPTION OF THE PREFERRED EMBODIMENTS

Figure 1:
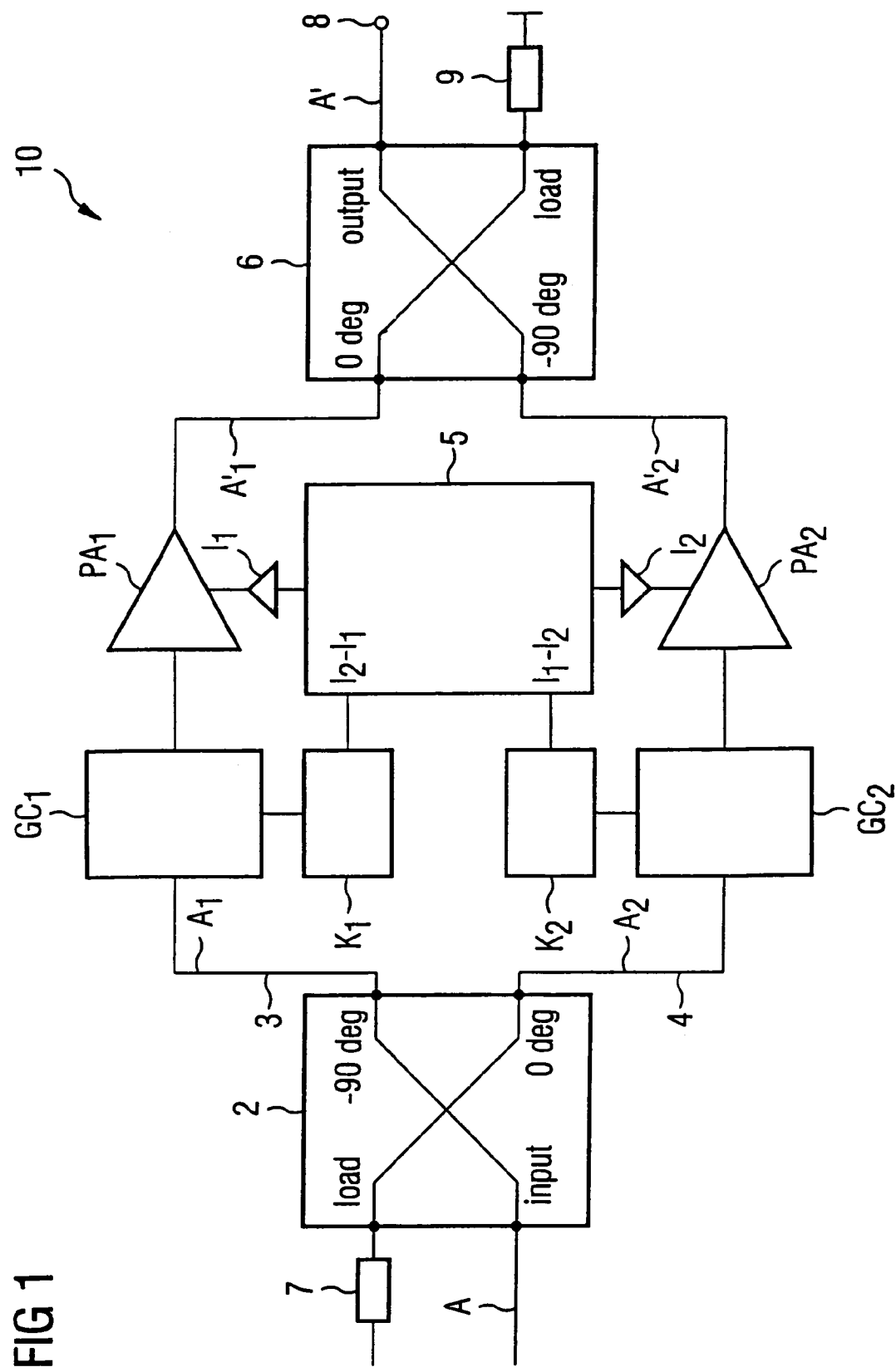
FIG. 1 shows a first exemplary embodiment of an inventive circuit arrangement with two amplification stages.

In the relatively simple exemplary embodiment shown in FIG. 1, the circuit arrangement 10 has only two connected amplification stages $PA_1$, $PA_2$ that are arranged in parallel to one another. These two amplification stages $PA_1$, $PA_2$ are formed from semiconductor power transistors. The circuit arrangement 10 is particularly suitable for amplification of radio-frequency pulses in magnetic resonance systems, which radio-frequency pulses generally being in a frequency range from 10 to 150 MHz.

On the input side, a signal splitter 2, which divides an input signal A into a first partial signal $A_1$ and a second partial signal $A_2$, is provided in the circuit arrangement 10, with each of the two partial signals $A_1$, $A_2$ exhibits half of the power of the input signal A. For this purpose, the signal splitter 2 has a signal input 1 at which the input signal A is present, a load input which is terminated by a termination resistance of, for example, 50 Ohm, and two signal outputs for the partial signals $A_1$, $A_2$. Via a delay unit at the signal output for the first partial signal $A_1$, the signal splitter 2 additionally causes the first partial signal $A_1$ to be phase-shifted by 90° relative to the second partial signal $A_2$.

The first partial signal $A_1$ is supplied to a first signal path 3 of a first amplification regulation device (variable gain control) $GC_1$. The second first partial signal $A_2$ is supplied to a second signal path 4 of a corresponding second amplification regulation device $GC_2$. The amplification regulation devices $GC_1$, $GC_2$ can also be controllable attenuators. Amplification stages (end stage) $PA_1$, $PA_2$ are respectively downstream from the two amplification regulation devices $GC_1$, $GC_2$. These amplification stages $PA_1$, $PA_2$ respectively amplify the partial signals $A_1$, $A_2$ coming from the respective amplification regulation devices $GC_1$, $GC_2$. The two amplification stages $PA_1$, $PA_2$ are connected with a current supply device 5 that a supply current to the respective amplification stage $PA_1$, $PA_2$. The respective supply currents $I_1$, $I_2$ depend on, among other things, the output power the appertaining amplification stage $PA_1$, $PA_2$ must deliver. This can be influenced by an adjustment of the amplification regulation devices $GC_1$, $GC_2$.

In accordance with the invention, in order to achieve the regulation of the amplification of the individual partial signals $A_1$, $A_2$ dependent on the difference currents, a difference signal that represents the difference of the supply current $I_2$ required by the second amplification stage $PA_2$ and the supply current $I_1$ required by the first amplification stage $PA_1$ is output by the current supply device 5 at a first output. This signal is output to a first amplification factor calculation device $K_1$ that calculates an amplification factor $G_1$ according to a predetermined control function. The calculation can thereby ensue according to the following equation:

$$G_1 = k_1(I_2 - I_1) + k_0 \quad (1a)$$

The summand $k_0$ is the control signal for the amplification regulation device $GC_1$, which alone predetermines the nominal amplification factor for the first amplification stage. This means that it is a basic amplification, which is externally provided to the entire circuit arrangement 10 in order to achieve a determined (overall) amplification in the circuit arrangement 10.

This externally provided or determinable amplification factor is then corrected by a correction element $k_1(I_2 - I_1)$ that depends on the aforementioned current difference $(I_2 - I_1)$. $k_1$ is an arbitrary positive constant which, if applicable, can be dependent on the specific design of the amplification stage $PA_1$ (for example on the transfer function or other parameters of this amplification stage $PA_1$), or on the design of the conductor transistors.

Alternatively, instead of a linear correction function as in equation (1a) a different monotonous function can be selected, for example a quadratic or logarithmic function. Examples are a calculation of the amplification factor $G_1$ according to $$G_1 = k_1\sqrt{I_2 - I_1} + k_0 \quad (2a)$$

or according to $$G_1 = k_1 \cdot \log(I_2 - I_1) + k_0 \quad (3a)$$

The amplification factor $G_2$ for the second amplification stage $PA_2$ is established in the same manner.

For this purpose, a signal that represents the current difference between the supply current $I_1$ for the first circuit arrangement and the supply current $I_2$ of the second circuit arrangement $PA_2$ is output by the current supply device 5 at a further output. In terms of magnitude, it is the same difference signal as that for the first amplification factor calculation device $K_1$, but with the opposite polarity sign. This signal is then supplied to a second amplification factor calculation device $K_2$ that calculates the amplification factor $G_2$ for the amplification regulation device $GC_2$ of the second partial signal $A_2$. This ensues (for example analogous to the equation (1a) described above) according to $$G_2 = k_2(I_1 - I_2) + k_0. \quad (1b)$$

If the regulation of the amplification in the first amplification stage $PA_1$ ensues according to equation (2a), the amplification of the second amplification stage $PA_2$ correspondingly ensues according to $$G_2 = k_2\sqrt{I_1 - I_2} + k_0 \quad (2b)$$

or, if as the amplification ensues with a logarithmic correction function according to equation (3a), according to $$G_2 = k_2 \cdot \log(I_1 - I_2) + k_0. \quad (3b)$$

The calculation of the amplification factors $G_1$, $G_2$ thus ensues nearly symmetrically except for the correction factor, in which the opposite current difference as in the regulation of the amplification of the first amplification stage $PA_1$ is drawn upon for regulation of the amplification of the second amplification stage $PA_2$. The constant factors $k_1$ and $k_2$ can in principle be identical.

The output partial signals $A_1'$, $A_2'$ respectively amplified by the amplification stages $PA_1$, $PA_2$ are then supplied to a signal combination unit 6.

This signal combination unit 6 is functionally designed in a manner similar to that of the signal splitter 2. It has two inputs for the two partial signals $A_1'$, $A_2'$, whereby it is now provided that the second partial signal $A_2'$ is phase-delayed [sic] by 90° relative to the first partial signal $A_1'$ such that the combination of the two partial signals ensues again in phase. Moreover, the signal combination unit 6 has a signal output 8 at which the recombined, amplified output signal A' is output and a load output which is terminated by a termination resistance 9 of, for example, 50 Ω.

With the aid of the inventive method it is provided as described above that, when the first amplification stage $PA_1$ requires a higher supply current $I_1$ than the second amplification stage $PA_2$, the amplification in the first amplification stage $PA_1$ is regulated downward and the amplification in the second amplification stage $PA_2$ is regulated upward in a corresponding manner. By contrast, if the supply current $I_2$ of the second amplification stage $PA_2$ is higher than the supply current $I_1$ of the first amplification stage $PA_1$, the amplification in the second amplification stage $PA_2$ is correspondingly regulated downward and that of the first amplification stage $PA_1$ is appropriately increased. In this manner a compensation of the supply currents $I_1$, $I_2$ is achieved, meaning that the same temperature conditions predominate in both amplification stages $PA_1$, $PA_2$ and the same output powers are generated. The power losses within the circuit are thereby significantly reduced and an early deactivation of an amplification stage due to reaching the maximum allowable junction temperature is avoided.

In the design shown in FIG. 2, two such circuit arrangements 10 according to FIG. 1 are coupled together, with each of these circuit arrangements 10 (designated in the following as "subordinate circuit arrangement" 10) forming an amplification stage $PA_U$, $PA_L$ within a "superordinate circuit arrangement" 11.

This superordinate circuit arrangement 11 is in turn designed as a circuit arrangement according to FIG. 1. This means that the superordinate circuit arrangement 11 has a signal splitter 2 on the input side, which divides the input signal A into two partial signals $A_U$, $A_L$. This signal splitter 2 is designed in the same manner as the signal splitter 2 described above in connection with FIG. 1. These partial signals $A_U$, $A_L$ are then amplified in the separate signal paths 12, 13. As already described, a circuit arrangement 10 as it is shown in FIG. 1 is located in each of the signal paths 12, 13 as an amplification stage $PA_U$, $PA_L$.

Amplification regulation devices $GC_U$, $GC_L$ with which the respective amplification factor can be adjusted is respectively upstream from the amplification stages $PA_U$, $PA_L$. The amplification regulation devices $GC_U$, $GC_L$ are respectively activated by amplification factor calculation devices $K_U$, $K_L$ in which the respective amplification factors are calculated. The regulation respectively ensues (analogous to the method described above using FIG. 1) dependent on the difference of the supply currents required by the respective amplification stages $PA_U$, $PA_L$.

Figure 2:
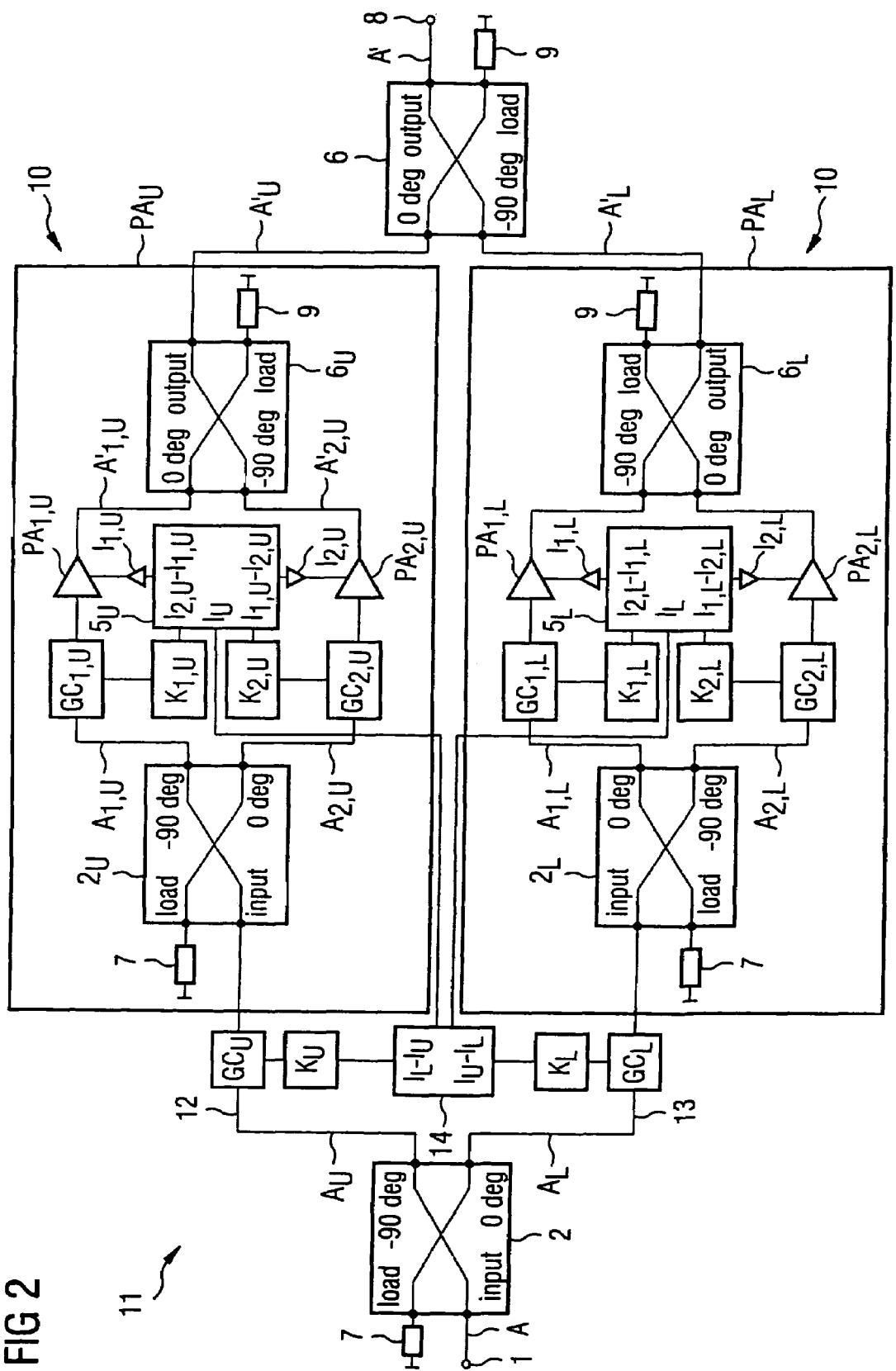
FIG. 2 shows a second exemplary embodiment of an inventive circuit arrangement with a cascade-like design with four amplification stages.

For this purpose, the supply device $5_U$ outputs the total current $I_U = I_{1,u} + I_{2,u}$ to the upper amplification stage $PA_U$ in FIG. 2, with $I_{1,u}$ being the supply current required by the first amplification stage $PA_{1,u}$ within the upper amplification stage $PA_U$ and $I_{2,u}$ being the supply current required by the second amplification stage $PA_{1,u}$ within the upper amplification stage $PA_U$.

The sum current $I_L = I_{1,L} + I_{2,L}$ of the current supply device $5_L$ of the lower amplification stage $PA_L$ shown in FIG. 2 is output in the same manner.

These "sum supply currents" $I_U$, $I_L$ are then processed in a current difference calculation unit 14 in order to calculate from this the difference signals representing the corresponding current differences and to relay these to the amplification factor calculation units $K_U$, $K_L$. According to the amplification factors calculated by the amplification factor calculation units $K_U$, $K_L$ analogous to the equations (1a) through (3a) or (1b) through (3b), the regulation of the amplification then ensues with the aid of the amplification regulation devices $GC_U$, $GC_L$. Within the amplification stages $PA_U$, $PA_L$ (designed as described as an inventive circuit arrangement 10), the signals coming from the amplification regulation devices $GC_U$, $GC_L$ are then respectively divided up in a signal splitter $2_U$, $2_L$ into "subordinate partial signals" $A_{1,U}$, $A_{2,U}$, $A_{1,L}$, $A_{2,L}$ which are supplied to corresponding amplification regulation devices $GC_{1,U}$, $GC_{2,U}$, $GC_{1,L}$, $GC_{2,L}$ that are in turn activated by corresponding amplification factor calculation devices $K_{1,U}$, $K_{2,U}$, $K_{1,L}$, $K_{2,L}$. As already described in connection with FIG. 1, this activation ensues using the difference currents between the individual amplification stages $PA_{1,U}$, $PA_{2,U}$ or $PA_{1,L}$, $PA_{2,L}$. The individual amplified partial signals $A'_{1,U}$, $A'_{2,U}$, $A'_{1,L}$, $A'_{2,L}$ are initially combined within the amplification stages $PA_U$, $PA_L$ in corresponding signal combination elements $6_U$, $6_L$ and are thus the output signals of the subordinate circuit arrangements 10 or of the respective amplification stages $PA_U$, $PA_L$ and thus also the amplified partial signals $A'_U$, $A'_L$ of the superordinate circuit arrangement 11. These partial signals $A'_U$, $A'_L$ are supplied to a signal combination unit 6 and there combined into a common output signal A'.

The cascade-like design can be further modified according to the inventive principle since circuit arrangements with a plurality of amplification stages can also be realized. This means that a very high number of 2, 4, 8, 16, 32, 64 . . . amplification stages can be coupled with one another in this manner, and according to the inventive design all amplification stages are always uniformly loaded and operate at the same junction temperatures, preferably just under the maximum allowable junction temperature.

In summary, the circuit arrangements described in the preceding are only exemplary embodiments, which can be modified in various manners by those skilled in the art without dissipating the scope of the invention. For example, all amplification stages can be operated by only one current supply device, for example in a cascade-like design. It is likewise also possible to measure the currents on the way from the current supply device to the respective amplification stages. Furthermore, all amplification factors can be calculated in a common control device or, respectively, amplification factor calculation device and be output to the respective amplification regulation devices. Moreover, the amplification stages do not necessarily have to each have their own separate regulation device, but rather can be coupled with a common regulation device.

Although modifications and changes may be suggested by those skilled in the art, it is the intention of the inventor to embody within the patent warranted hereon all changes and modifications as reasonably and properly come within the scope of his contribution to the art.

I claim as my invention:

1. An amplification circuit comprising:
   a signal splitter supplied with an input signal that divides said input signal into a first partial signal and a second partial signal;
   a first signal path supplied with said first partial signal from said signal splitter, said first signal path comprising a first amplification stage that amplifies said first partial signal;
   a second signal path supplied with said second partial signal from said signal splitter, said second signal path comprising a second amplification stage that amplifies said second partial signal;
   a current supply that supplies current to each of said first and second signal amplification stages;
   a signal combiner connected downstream from said first and second amplification stages that re-combines the first and second partial signals, respectively amplified by said first and second amplification stages, to form an output signal; and
   a regulation device connected to each of said first amplification stage and said second amplification stage that regulates amplification of said first partial signal dependent on a current difference between a supply current requirement of the second amplification stage and a supply current requirement of the first amplification stage, and that regulates amplification of the second partial signal dependent on a difference between the supply current requirement of the first amplification stage and the supplied current requirement of the second amplification stage.

2. An amplification circuit as claimed in claim 1 wherein said signal splitter produces a phase shift between said first and second partial signals, and wherein said signal combiner resets said phase shift.

3. An amplification circuit as claimed in claim 2 wherein said signal splitter causes a phase shift of 90°.

4. An amplification circuit as claimed in claim 1 wherein said input signal is a radio-frequency electrical signal.

5. An amplification circuit as claimed in claim 1 wherein said regulation device comprises a first regulation unit connected upstream of said first amplification stage in said first signal path and a second regulation unit connected upstream of said second amplification stage in said second signal path.

6. An amplification circuit as claimed in claim 1 wherein said signal splitter, said first and second signal paths, said first and second amplification stages, said signal combiner, and said regulation device comprise a first circuit, and wherein said amplification circuit comprises:
   a second circuit conforming to said first circuit, said first circuit having a first input signal supplied thereto and said second circuit having a second input signal supplied thereto;
   a hierarchical signal splitter connected upstream of said first and second circuits and supplied with a hierarchical input signal, said hierarchical signal splitter splitting said hierarchical input signal into said first input signal and said second input signal;
   a hierarchical signal combiner that recombines the respective output signals of said first and second circuits to form a hierarchical output signal; and
   a hierarchical regulation device that regulates the regulation device of the first circuit dependent on a current difference between a supply current requirement of the second circuit and a supply current requirement of the first circuit, and that regulates the regulation device of the second circuit dependent on a current difference between the supply current requirement of the first circuit and the supply current requirement of the second circuit.

7. A method for amplifying an input signal comprising the steps of:
   dividing an input signal into a first partial signal and a second partial signal;
   amplifying said first partial signal and a first amplification stage and amplifying said second partial signal in a second amplification stage;
   recombining the amplified first partial signal and the amplified second partial signal;
   regulating amplification of the first amplification stage dependent on a current difference between a supply current requirement of the second amplification stage and a supply current requirement of the first amplification stage; and
   regulating amplification of the second amplification stage dependent on a current difference between the supply current requirement of the first amplification stage and the supply current requirement of the second amplification stage.

8. A method as claimed in claim 7 comprising correct an amplification factor of said first amplification stage with a correction function dependent on said current difference between said supply current requirement of the second amplification stage and said supply current requirement of the first amplification stage; and
   correcting an amplification factor of the second amplification stage with a correction function dependent on said current difference between said supply current requirement of the first amplification stage and said supply current of the second amplification stage.

9. A method as claimed in claim 8 comprising employing mathematically monotonous functions as the respective correction functions.

10. A method as claimed in claim 9 comprising selecting said correction functions from the group consisting of linear functions, quadratic functions, and logarithmic functions.

11. A method as claimed in claim 7 comprising phase shifting said first and second partial signals relative to each other when dividing said input signal into said first and second partial signals, and resetting said phase shift when recombining the amplified first and second partial signals.

12. A method as claimed in claim 11 comprising phase shifting said first and second partial signals by 90° relative to each other.

13. A method as claimed in claim 7 wherein said signal splitter, said first and second signal paths, said first and second amplification stages, said signal combiner, and said regulation device comprise a first circuit, and comprising:
   providing a second circuit conforming to said first circuit;
   connecting a hierarchical signal splitter upstream of said first and second circuits and supplying said hierarchical signal splitter with a hierarchical input signal, said hierarchical signal splitter splitting said hierarchical input signal into a first input signal and a second input signal and supplying said first input signal to said circuit and second input signal to said second circuit;
   recombining the respective output signals of said first and second circuits in a hierarchical signal combiner to form a hierarchical output signal; and
   in a hierarchical regulation device, regulating the regulation device of the first circuit dependent on a current difference between a supply current requirement of the second circuit and a supply current requirement of the first circuit, and that regulates the regulation device of the second circuit dependent on a current difference between the supply current requirement of the first circuit and the supply current requirement of the second circuit.

14. A magnetic resonance system comprising:

a magnetic resonance scanner comprising a basic field magnet, a gradient coil system and a radio-frequency antenna system;

a sequence controller connected to said magnetic resonance scanner that supplies a pulse sequence to said gradient coil system and to said radio-frequency antenna system to operate said magnetic resonance scanner to acquire magnetic resonance data from a subject therein;

a source of radio-frequency signals; and an amplification circuit connected between said source of radio-frequency signals and said radio-frequency antenna system, said amplification circuit comprising a signal splitter supplied with an input signal that divides said input signal into a first partial signal and a second partial signal, a first signal path supplied with said first partial signal from said signal splitter, said first signal path comprising a first amplification stage that amplifies said first partial signal, a second signal path supplied with said second partial signal from said signal splitter, said second signal path comprising a second amplification stage that amplifies said second partial signal, a current supply that supplies current to each of said first and second signal amplification stages, a signal combiner connected downstream from said first and second amplification stages that re-combines the first and second partial signals, respectively amplified by said first and second amplification stages, to form an output signal, and a regulation device connected to each of said first amplification stage and said second amplification stage that regulates amplification of said first partial signal dependent on a current difference between a supply current requirement of the second amplification stage and a supply current requirement of the first amplification stage, and that regulates amplification of the second partial signal dependent on a difference between the supply current requirement of the first amplification stage and the supplied current requirement of the second amplification stage.

* * * * *